(12) United States Patent
Wayama et al.

(10) Patent No.: US 8,508,011 B2
(45) Date of Patent: Aug. 13, 2013

(54) SEMICONDUCTOR APPARATUS AND METHOD OF MANUFACTURING THE SAME

(75) Inventors: Hiroshi Wayama, Honjo (JP); Chiori Mochizuki, Sagamihara (JP); Minoru Watanabe, Honjo (JP); Keigo Yokoyama, Honjo (JP); Masato Ofuji, Honjo (JP); Jun Kawanabe, Kodama-gun (JP); Kentaro Fujiyoshi, Kumagaya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/405,639

(22) Filed: Feb. 27, 2012

(65) Prior Publication Data

US 2012/0235270 A1  Sep. 20, 2012

(30) Foreign Application Priority Data

Mar. 17, 2011 (JP) ................................. 2011-059656

(51) Int. Cl.
*H01L 31/00* (2006.01)
(52) U.S. Cl.
USPC ................. 257/443; 257/59; 257/72; 438/48; 438/73
(58) Field of Classification Search
USPC ............... 257/443, 59, 72, E31.124; 438/48, 438/73
See application file for complete search history.

(56) References Cited

U.S. PATENT DOCUMENTS

| 5,751,381 | A | * | 5/1998 | Ono et al. ........................ 399/46 |
| 6,586,769 | B1 | | 7/2003 | Watanabe et al. ................ 257/72 |
| 6,682,960 | B1 | | 1/2004 | Mochizuki ..................... 438/149 |
| 6,812,494 | B2 | | 11/2004 | Mochizuki et al. .............. 257/75 |
| 6,956,216 | B2 | | 10/2005 | Ishii et al. ................. 250/370.09 |
| 7,719,650 | B2 | * | 5/2010 | Sugiyama et al. ............. 349/139 |
| 2010/0085081 | A1 | | 4/2010 | Ofuji et al. ..................... 326/102 |
| 2010/0117072 | A1 | | 5/2010 | Ofuji et al. ..................... 257/43 |
| 2010/0193639 | A1 | | 8/2010 | Spencer et al. ................ 250/366 |
| 2010/0238331 | A1 | | 9/2010 | Umebayashi et al. ......... 348/294 |
| 2012/0153277 | A1 | | 6/2012 | Yaginuma et al. .............. 257/43 |

FOREIGN PATENT DOCUMENTS

| JP | 2009-133837 | 6/2009 |
| JP | 2010-245506 | 10/2010 |

* cited by examiner

*Primary Examiner* — Theresa T Doan
(74) *Attorney, Agent, or Firm* — Fitzpatrick, Cella, Harper & Scinto

(57) ABSTRACT

A semiconductor apparatus including a substrate, a pixel array on the substrate, first and second conductive pads between which the substrate locates is provided. The apparatus also comprises an insulating layer arranged between the substrate and the first conductive pad; a third conductive pad arranged between the substrate and the insulating layer; a first conductive member which passes through the insulating layer and connects the first and third conductive pads to each other; and a second conductive member which passes through the substrate and connects the second and third conductive pads to each other. The pixel array further comprises a conductive line connected to circuit elements included in pixels aligned in a row or column direction. The first conductive pad is connected to the conductive line in an interval between the pixels.

6 Claims, 10 Drawing Sheets

SEMICONDUCTOR APPARATUS AND METHOD OF MANUFACTURING THE SAME

BACKGROUND OF THE INVENTION

1. Field of the Invention

The present invention relates to a semiconductor apparatus such as a detection apparatus including a radiation detection apparatus, and a method of manufacturing the same.

2. Description of the Related Art

Japanese Patent Laid-Open No. 2009-133837 proposes a radiation detection apparatus in which an external circuit and a semiconductor element in a pixel array are electrically connected to each other via a conductive adhesive material which penetrates through an insulating layer functioning as a substrate which supports the pixel array. The conductive adhesive material penetrates through the substrate on the outside of the pixel array, and the external circuit is arranged outside the outer periphery of the substrate.

SUMMARY OF THE INVENTION

In a semiconductor apparatus such as a detection apparatus including the radiation detection apparatus described in Japanese Patent Laid-Open No. 2009-133837, an external circuit is desirably arranged at the position at which it faces the back surface of the substrate to downsize the semiconductor apparatus. However, when an external circuit is arranged at the position at which it faces the back surface of the substrate, the parasitic capacitance generated between the external circuit and a circuit element and conductive line included in the pixel array increases. This parasitic capacitance can be reduced by increasing the thickness of the substrate. However, as the thickness of the substrate increases, the diameter of a contact hole extending through the substrate also increases, and the area of a conductive pad arranged on the back surface of the substrate, in turn, increases. Therefore, the parasitic capacitance generated between the conductive pad and the circuit element and conductive line included in the pixel array increases. In view of this, the present invention in its one aspect provides a technique for reducing the parasitic capacitances generated between circuit elements and conductive lines arranged on the front surface of a substrate, and an electronic circuit arranged on the back surface of the substrate in a semiconductor apparatus.

An aspect of the present invention provides a semiconductor apparatus including a substrate, a pixel array arranged on the substrate, a first conductive pad which is arranged on the substrate and electrically connected to a circuit element of the pixel array, and a second conductive pad arranged under the substrate to connect an electronic circuit, the apparatus comprising: an insulating layer arranged between the substrate and the first conductive pad; a third conductive pad arranged between the substrate and the insulating layer; a first conductive member which passes through a first contact hole extending through the insulating layer, and connects the first conductive pad and the third conductive pad to each other; and a second conductive member which passes through a second contact hole extending through the substrate, and connects the second conductive pad and the third conductive pad to each other, wherein the pixel array further comprises a conductive line connected to circuit elements included in a plurality of pixels aligned in one of a row direction and a column direction, and the first conductive pad is connected to the conductive line in an interval between the plurality of pixels aligned in the one of the row direction and the column direction.

Another aspect of the present invention provides a method of manufacturing a semiconductor apparatus comprising a substrate, a pixel array which is arranged on the substrate and includes a conductive line connected to a circuit element included in each of a plurality of pixels aligned in one of a row direction and a column direction, a first conductive pad which is arranged on the substrate and electrically connected to the circuit element of the pixel array, and a second conductive pad which is arranged under the substrate to connect an electronic circuit, the method comprising: forming a third conductive pad on the substrate; forming an insulating layer on the third conductive pad; forming a first contact hole which extends through the insulating layer and exposes a surface of the third conductive pad on a side of the insulating layer; forming a first conductive member which passes through the first contact hole and is connected to the third conductive pad; forming, on the insulating layer, the first conductive pad which is connected to the first conductive member, and connected to the conductive line in an interval between the plurality of pixels aligned in the one of the row direction and the column direction; forming the pixel array on the insulating layer; forming a second contact hole which extends through the substrate and exposes a surface of the third conductive pad on a side of the substrate; forming a second conductive member which passes through the second contact hole and is connected to the third conductive pad; and forming, under the substrate, a second conductive pad connected to the second conductive member.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Various embodiments of the present invention will be described in detail below with reference to the accompanying drawings. The present invention is applicable to an arbitrary semiconductor apparatus including a substrate that includes a circuit element and conductive line arranged on its first surface, and an electronic circuit arranged at the position at which it faces its second surface opposite to the first surface. In the following description, a surface having a circuit element and conductive line will be referred to as the front surface of a substrate, and a surface opposite to the former surface will be referred to as the back surface of the substrate. Also, the direction from the back surface to the front surface of a substrate is defined as an upward direction, and that from the front surface to the back surface of the substrate is defined as a downward direction. Examples of such a semiconductor apparatus include a detection apparatus which detects incident radiation, and a display apparatus which displays an image. However, the detection apparatus will be described below. The detection apparatus can include, as a circuit element, a conversion element which converts an electromagnetic wave containing light such as visible light or infrared light, or radiation such as X-rays, α-rays, β-rays, or γ-rays into an electrical signal, and a thin film transistor functioning as a switching element. Also, the circuit element may include, for example, a resistor.

Figure 1A:
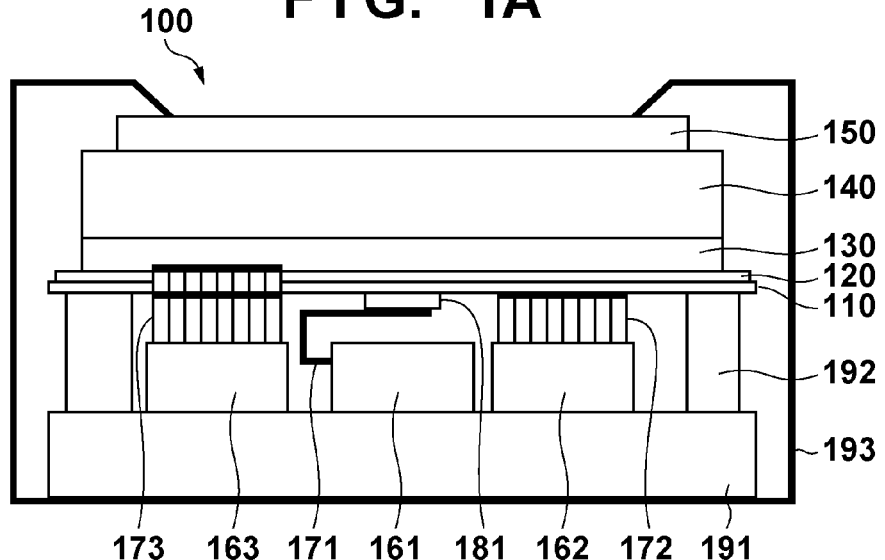
FIGS. 1A and 1B are a front schematic view and plan schematic view for explaining the exemplary configuration of a detection apparatus 100 according to the first embodiment.
Figure 1B:
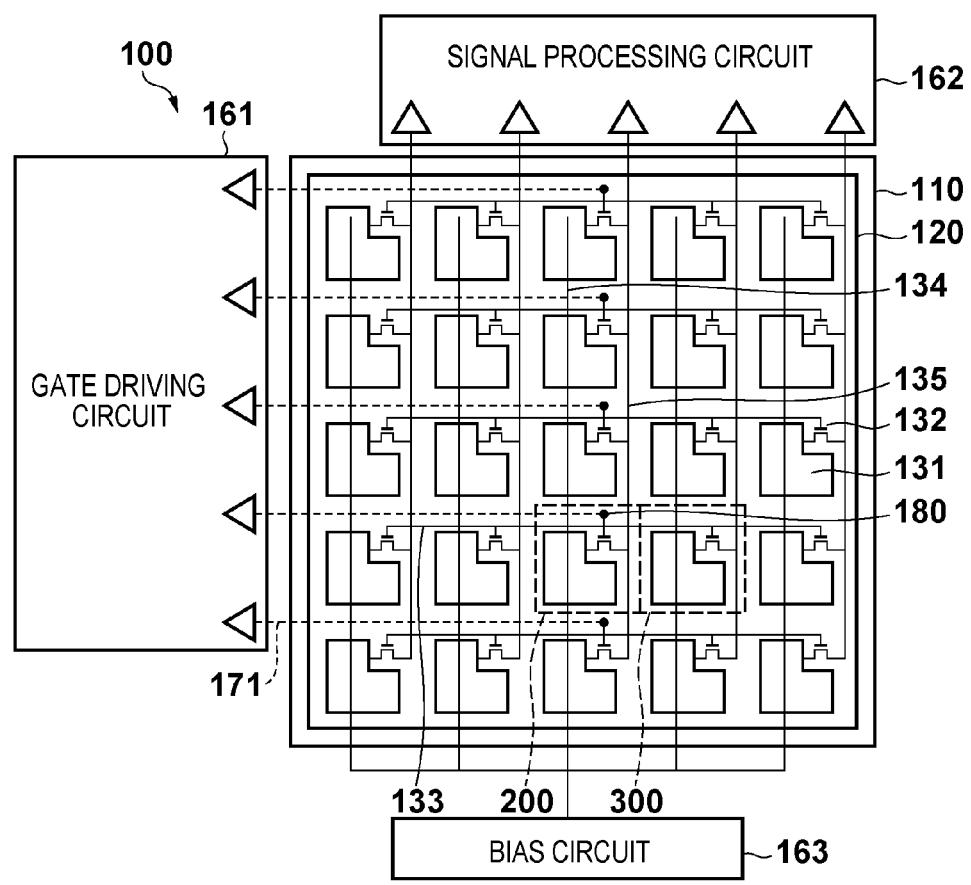

An example of the entire configuration of a detection apparatus 100 according to the first embodiment of the present invention will be described with reference to FIGS. 1A and 1B. FIG. 1A is a front schematic view of the detection apparatus 100, and FIG. 1B is a plan schematic view of the detection apparatus 100. FIG. 1B shows a semiconductor element as an equivalent circuit, and does not illustrate some of components shown in FIG. 1A, for the sake of easy viewing.

As shown in FIG. 1A, in the detection apparatus 100, an insulating layer 120 can be arranged on a substrate 110, and a pixel array 130 can be arranged on the insulating layer 120. The substrate 110 can be formed by a material having insulation properties, such as glass or heat-resistant plastic. The insulating layer 120 can be formed by an organic or inorganic material. A scintillator 140 can be arranged on the pixel array 130, and a cover 150 can be arranged on the scintillator 140. The substrate 110 is fixed on a base 191 via a support 192. A gate driving circuit 161, a signal processing circuit 162, and a bias circuit 163 are arranged on the base 191 as electronic circuits. At least one of these electronic circuits can be arranged at the position at which it faces the back surface of the substrate 110. In particular, these electronic circuits may be arranged at positions at which they overlap the pixel array 130 when viewed from the front side of the detection apparatus 100. A conductive pad 181 electrically connected to the pixel array 130 via a conductive member which passes through the substrate 110 and insulating layer 120 is arranged under the substrate 110. The gate driving circuit 161 is connected to the conductive pad 181 via a flexible cable 171. As a result, the gate driving circuit 161 is electrically connected to the pixel array 130. The signal processing circuit 162 is electrically connected to the pixel array 130 via a flexible cable 172. The bias circuit 163 is electrically connected to the pixel array 130 via a flexible cable 173. The detection apparatus 100 is surrounded by an outer box 193 so that the cover 150 is partially exposed. Radiation enters the detection apparatus 100 from the exposed portion, this radiation is converted into visible light by the scintillator 140, and this visible light is detected by the pixel array 130. FIG. 1A does not illustrate the surface of the outer box 193 on the viewpoint side so as to visually recognize the interior of the detection apparatus 100.

An example of the configuration of the pixel array 130 will be described next with reference to FIG. 1B. FIG. 1B shows the gate driving circuit 161, signal processing circuit 162, and bias circuit 163 so that they fall outside the outer periphery of the substrate 110, for the sake of easy viewing. However, these electronic circuits can be arranged at positions at which they face the back surface of the substrate 110, as described earlier. The pixel array 130 can include a plurality of pixels arrayed in a two-dimensional array, and conductive lines connected to these pixels. Although 5 (rows)×5 (columns) pixels are shown in FIG. 1B for the sake of easy viewing, the number of pixels is not limited to this. The pixel pitch can be designed as, for example, 0.1 mm to 0.2 mm. Each pixel can include a photoelectric conversion element 131 and thin film transistor 132 as circuit elements. One main electrode, for example, the first main electrode of the thin film transistor 132 is connected to the electrode of the photoelectric conversion element 131. The thin film transistor 132 functions as a transfer transistor for transferring a signal from the photoelectric conversion element 131.

The pixel array 130 can also include a plurality of gate lines 133 running in the row direction, a plurality of bias lines 134 running in the column direction, and a plurality of signal lines 135 running in the column direction. The gate line 133 is connected to the gates of the thin film transistors 132 of the plurality of pixels aligned in the row direction. The bias line 134 is connected to the electrodes of the photoelectric conversion elements 131 of the plurality of pixels aligned in the column direction. The signal line 135 is connected to the other main electrode, for example, the second main electrode of each of the thin film transistors 132 of the plurality of pixels aligned in the column direction. In this manner, the pixel array 130 can include the photoelectric conversion elements 131 and thin film transistors 132 as circuit elements, and the gate lines 133, bias lines 134, and signal lines 135 as conductive lines. The gate line 133 can be connected to the flexible cable 171, positioned on the lower side of the substrate 110, via a conductive connection part 180 for electrically connecting the upper and back surfaces of the substrate 110 to each other. As will be described later, the conductive connection part 180 can include a conductive pad (first conductive pad) 182 arranged on the substrate 110, and the conductive pad (second conductive pad) 181 arranged under the substrate 110. Note that the conductive pad 182 is electrically connected to the circuit elements of the pixel array, and the conductive pad 181 serves to connect the electronic circuits. Also, the detection apparatus 100 can include the insulating layer 120 arranged between the substrate 110 and the conductive pad 182 and pixel array 130, and the conductive connection part 180 can include a conductive pad (third conductive pad) 183 arranged between the insulating layer 120 and the substrate 110. The conductive connection part 180 can also include a conductive member (first conductive member) 187 which passes through the insulating layer 120 to connect the conductive pads 182 and 183 to each other, and a conductive member (second conductive member) 185 which passes through the substrate 110 to connect the conductive pads 181 and 183 to each other.

In the detection apparatus 100, an electronic circuit such as the gate driving circuit 161 can be arranged under the substrate 110. Therefore, parasitic capacitances may be generated between the gate driving circuit 161 and the semiconductor element and conductive lines in the pixel array 130. When the generated parasitic capacitances are high, an artifact may be generated in an image obtained by the detection apparatus 100. Hence, in this embodiment, to reduce these parasitic capacitances, not only the substrate 110 but also the insulating layer 120 is arranged between the pixel array 130 and the gate driving circuit 161. Arranging the insulating layer 120 increases the distance between the pixel array 130 and the gate driving circuit 161, and this can reduce parasitic capacitances generated between the gate driving circuit 161 and the semiconductor element and conductive lines in the pixel array 130. To further reduce the parasitic capacitances, the insulating layer 120 may have a dielectric constant lower than that of the substrate 110. When, for example, the substrate 110 has a dielectric constant of 4 to 4.5, the insulating layer 120 may be formed by an organic material having a dielectric constant of 3 to 4. The freedom of the layout of the gate driving circuit 161 improves by reducing the parasitic capacitances in this way, and the detection apparatus 100 can be downsized by arranging the gate driving circuit 161 on the lower side of the substrate 110, compared to the arrangement of the gate driving circuit 161 on the outside of the outer periphery of the substrate 110. In this example, the side on which the pixel array 130 is arranged with respect to the substrate 110 is defined as the upper side, and the side opposite to that on which the pixel array 130 is arranged with respect to the substrate 110 is defined as the lower side, in the same way as in the definition described earlier.

Also, the parasitic capacitances between the conductive pad 181 arranged under the substrate 110, and the semiconductor element and conductive lines in the pixel array 130 can be reduced by arranging the insulating layer 120 between the pixel array 130 and the substrate 110. This makes it possible to arrange the conductive pad 181 at an arbitrary position on the back surface of the substrate 110. As a result, a signal voltage can be applied from the gate driving circuit 161 to the gate line 133 at an arbitrary position via the conductive connection part 180. In general, as the product of the resistance of a conductive line and the parasitic capacitance generated on the conductive line, that is, the time constant increases, the waveform of the signal voltage transmitted through the conductive line changes more considerably. Also, as the time (pulse width) taken to apply a signal voltage shortens, the waveform deforms more considerably. Therefore, as the length of a conductive line from the position at which a signal voltage is applied to the conductive line to a pixel shortens, the waveform deforms more considerably, so this pixel can be driven at a higher speed. In the detection apparatus 100, the length of the gate line 133 from the position at which a signal voltage is applied to the gate line 133 to a farthest pixel can be shortened by connecting the conductive pad 181 to the gate line 133 in the interval between the plurality of pixels aligned in the row direction, as shown in FIGS. 1A and 1B. A signal voltage may be applied from the gate driving circuit 161 to the gate line 133 especially at the central portion of the plurality of pixels aligned in the row direction. Note that the central portion need not be exactly the center, and can be fall within the range of, for example, ±10% (inclusive) from the center. In this configuration, the length of a conductive line from the position at which a signal voltage is applied to the conductive line to a farthest pixel can be shortened, compared to application of a signal voltage from the exterior of the plurality of pixels aligned in the row direction. As a result, the pixels can be driven at high speed.

Figure 2A:
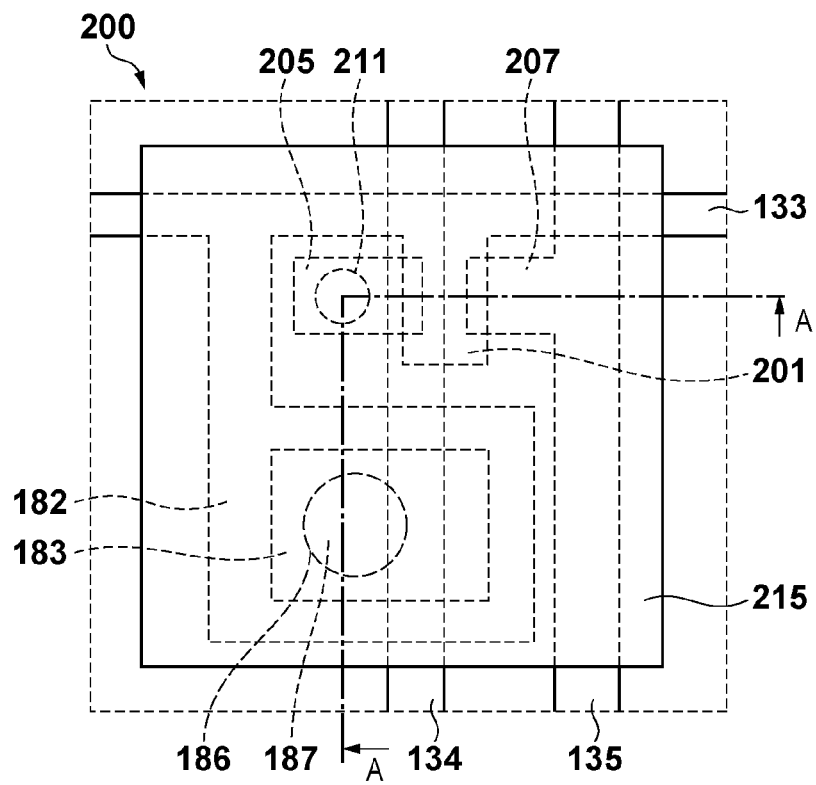
FIGS. 2A and 2B are a plan view and sectional view for explaining the exemplary configuration of a pixel 200 according to the first embodiment.
Figure 2B:
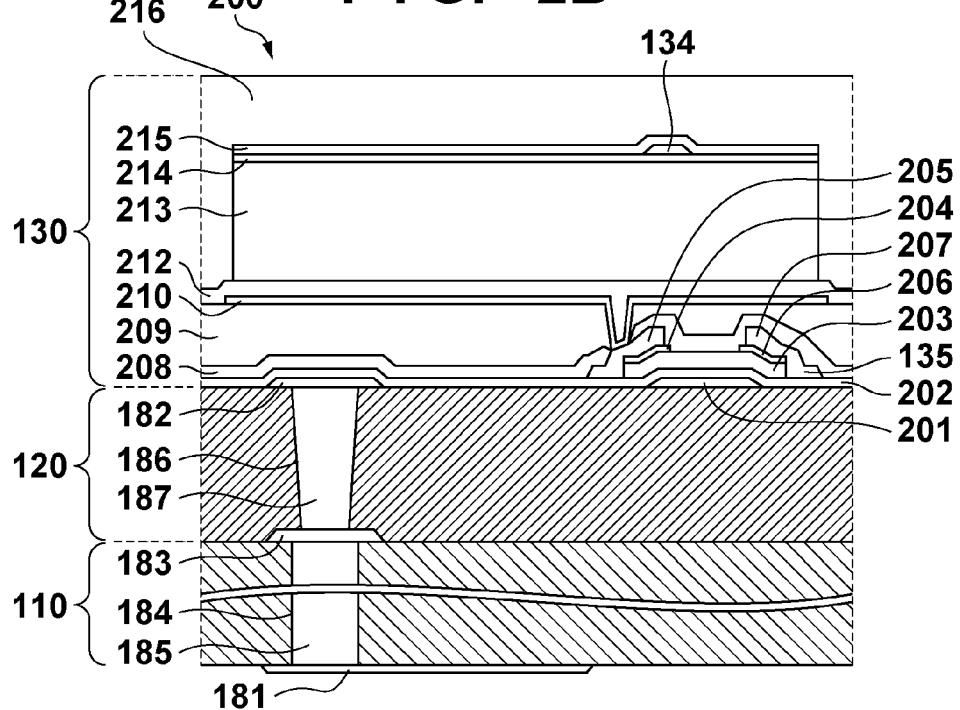
Figure 3A:
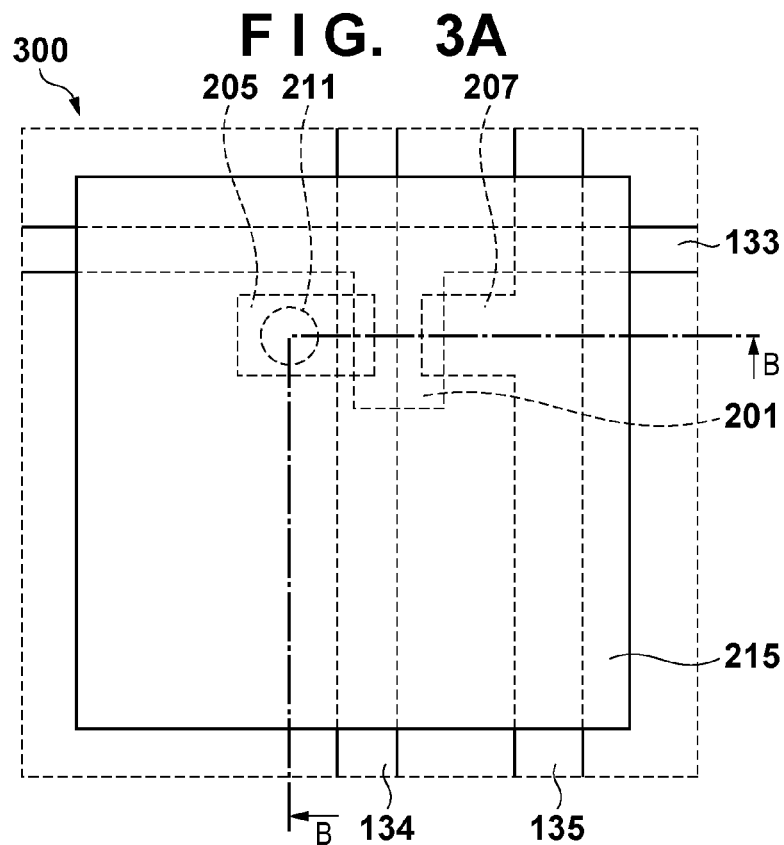
FIGS. 3A and 3B are a plan view and sectional view for explaining the exemplary configuration of a pixel 300 according to the first embodiment.
Figure 3B:
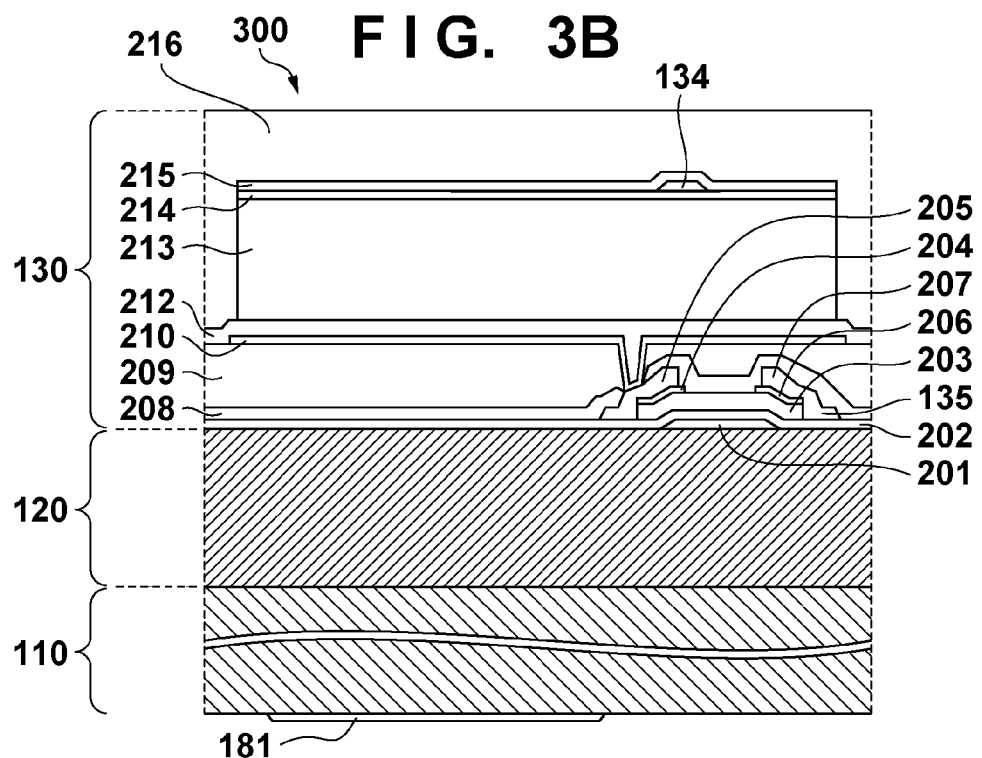

A pixel 200 including the conductive connection part 180 and a pixel 300 including no conductive connection part 180 shown in FIG. 1B will be described in detail next with reference to FIGS. 2A to 3B. FIG. 2A is a plan view of the pixel 200, and FIG. 2B is a sectional view taken along a line A-A in FIG. 2A. FIG. 3A is a plan view of the pixel 300, and FIG. 3B is a sectional view taken along a line B-B in FIG. 3A. Referring to FIGS. 2A to 3B, an outer dotted line indicates the boundary between adjacent pixels. FIGS. 2A to 3B illustrate only portions associated with the substrate 110, insulating layer 120, and pixel array 130 in the detection apparatus 100, for the sake of easy viewing.

The insulating layer 120 is arranged on the substrate 110, as described earlier. A conductive pattern including a gate electrode 201, the gate line 133, and the conductive pad 182 is arranged on the insulating layer 120. The gate electrode 201 and conductive pad 182 are connected to the gate line 133. An insulating layer 202 is arranged on the gate electrode 201, gate line 133, and conductive pad 182. The insulating layer 202 can function as a gate insulating film for the thin film transistor 132. A semiconductor layer 203 is arranged on the gate electrode 201 via the insulating layer 202. A first main electrode 205 of the thin film transistor 132 is arranged on the semiconductor layer 203 via an impurity layer 204 on one side, and a second main electrode 207 of the thin film transistor 132 is arranged on the semiconductor layer 203 via an impurity layer 206 on the other side. The thin film transistor 132 can be formed by the gate electrode 201, insulating layer 202, semiconductor layer 203, impurity layers 204 and 206, first main electrode 205, and second main electrode 207. The second main electrode 207 is connected to the signal line 135 arranged on the insulating layer 202.

An insulating layer 208 is arranged on the thin film transistor 132 and insulating layer 202, and a planarizing layer 209 is arranged on the insulating layer 208. An electrode 210 is arranged on the planarizing layer 209. The electrode 210 is partially connected to the first main electrode 205 via a contact hole 211 extending through the insulating layer 208 and planarizing layer 209. The electrode 210 is covered with an insulating layer 212. The insulating layer 212 insulates the electrodes 210 of adjacent pixels from each other. A semiconductor layer 213, an impurity layer 214, and an electrode 215 are sequentially arranged on the insulating layer 212. The photoelectric conversion element 131 can be formed by the electrode 210, insulating layer 212, semiconductor layer 213, impurity layer 214, and electrode 215. The bias line 134 is arranged between the impurity layer 214 and the electrode 215, and the electrode 215 and the bias line 134 are connected to each other. An insulating layer 216 is arranged to cover the photoelectric conversion element 131. The insulating layer 216 insulates the photoelectric conversion elements 131 of adjacent pixels from each other.

The detection apparatus 100 also includes the conductive pad 183 arranged on the substrate 110, and the insulating layer 120 arranged on the conductive pad 183. A contact hole 184 is formed in the substrate 110 to extend through the substrate 110, and the conductive member 185 which passes through the contact hole 184 connects the conductive pads 181 and 183 to each other. Also, a contact hole 186 is formed in the insulating layer 120 to extend through the insulating layer 120, and the conductive member 187 which passes through the contact hole 186 connects the conductive pads 182 and 183 to each other. The conductive pads 181, 182, and 183 and conductive members 185 and 187 can constitute the conductive connection part 180. The conductive pad 181 is connected to the gate driving circuit 161 via the flexible cable 171, as shown in FIG. 1A, and the conductive pad 182 is connected to the gate line 133, as shown in FIG. 2A. Therefore, the gate driving circuit 161 and the thin film transistor 132 in the pixel array 130 are electrically connected to each other via the conductive connection part 180.

The substrate 110 can have a thickness of, for example, about 0.1 mm to 0.3 mm, and the insulating layer 120 can have a thickness of, for example, 10 μm or less. The conductive pad 181 need only have a shape and size that allow it to be connected to the flexible cable 171, and can have, for example, a rectangular shape with a size of about 1 mm×0.1 mm. The conductive pad 182 need only have a shape and size that allow alignment in forming the contact holes 184 and 186, and can have, for example, a rectangular shape with a size of about 0.1 mm×0.2 mm or a circular shape with a diameter of about 0.1 mm. When the conductive pad 182 has such a size, it can be arranged in one pixel. Alternatively, the conductive pad 182 may have a rectangular shape, about 0.2 mm to 1 mm on each side, or a circular shape with a diameter of about 0.5 mm. In this case, the conductive pad 182 extends across a plurality of pixels. The contact holes 184 and 186 can have, for example, a circular shape with a diameter of about 0.05 mm. The contact holes 184 and 186 need only have a width smaller than that of the conductive pad 183 in a direction along a plane parallel to the substrate 110, and have a width smaller than that of the conductive pad 183 by, for example, about 0.05 mm. The conductive pad 183 can include, for example, a rectangular part with a size of about 0.1 mm×0.1 mm, and a connection part which connects the rectangular part to the gate line 133.

Figure 4:
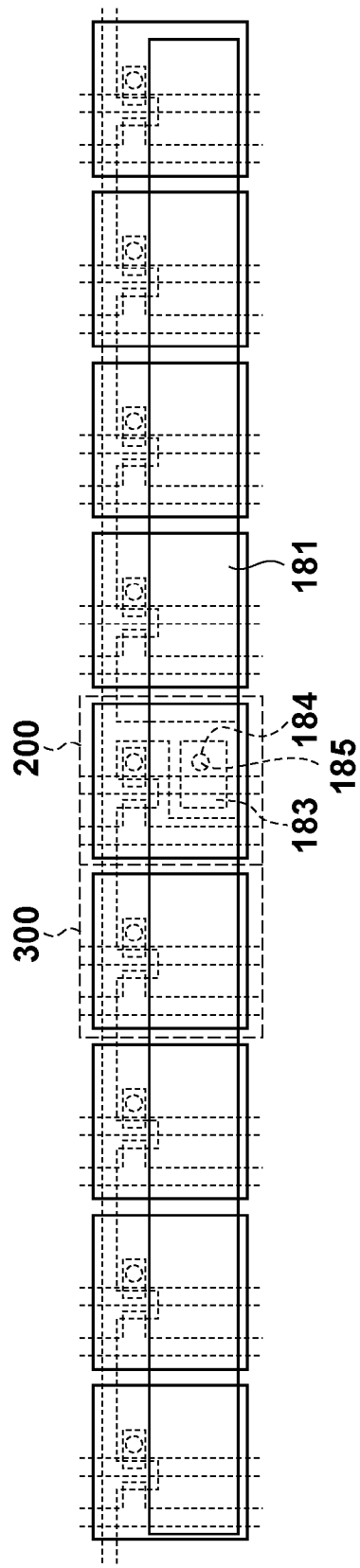
FIG. 4 is a bottom view for explaining an example of the arrangement of a conductive pad 181 according to the first embodiment.

When the conductive pad 181 has a rectangular shape with a size of about 1 mm×0.1 mm, and a pixel pitch of 0.1 mm to 0.2 mm, the conductive pad 181 can extend across a plurality of pixels, as shown in FIG. 4. FIG. 4 is a bottom view of the substrate 110, insulating layer 120, and pixel array 130 in the detection apparatus 100, and shows pixels in which the conductive pad 181 is arranged. The conductive pad 183 is arranged in the pixel 200, and the conductive pads 183 and 181 are connected to each other via the conductive member 185 which passes through the contact hole 184, as described earlier. The conductive pad 181 extends from the pixel 200 to pixels on its two sides in the row direction. The conductive pad 181 may extend from the pixel 200 to only the right or left side. Also, although the conductive pad 181 extending in the row direction is arranged to fall within the range of pixels on one row, it may extend across pixels on a plurality of rows.

The pixel 300 shown in FIGS. 3A and 3B includes none of the conductive pads 182 and 183, contact holes 184 and 186, and conductive members 185 and 187, unlike the pixel 200. Also, as shown in FIG. 4, the pixel 300 is adjacent to the pixel 200, so the conductive pad 181 is arranged under the substrate 110 in the pixel 300.

Figure 5A:
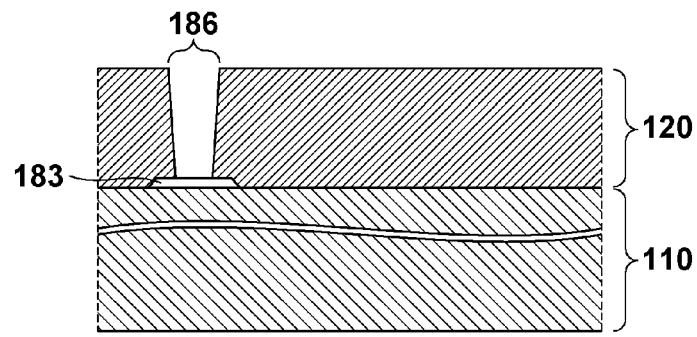
FIGS. 5A to 5C are views for explaining an exemplary method of manufacturing a detection apparatus 100 according to the first embodiment.

An example of a method of manufacturing a detection apparatus 100 will be described next with reference to FIGS. 5A to 5C. The method of manufacturing a detection apparatus 100 will be explained with reference to FIGS. 5A to 5C by focusing attention on the pixel 200 including the conductive connection part 180. First, a conductive pad 183 is formed on a substrate 110, as shown in FIG. 5A. The conductive pad 183 can be formed using a metal such as aluminum. An insulating layer 120 is formed on the conductive pad 183 at a thickness of 10 μm or less. A contact hole (first contact hole) 186 is formed to extend through the insulating layer 120 so that the surface of the conductive pad 183 on the upper side (on the side of the insulating layer 120) is exposed.

Figure 5B:
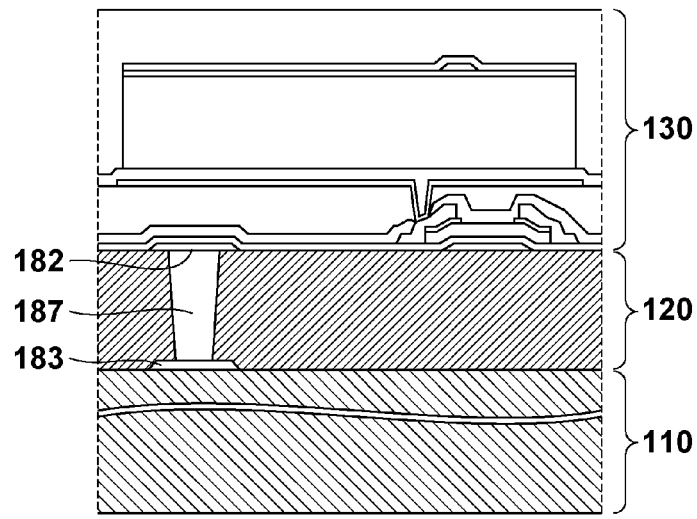

The contact hole 186 is filled with a conductive member 187 made of a metal such as tungsten, as shown in FIG. 5B. A conductive pattern including a conductive pad 182 which covers the conductive member 187, a gate electrode 201, and a gate line 133 is formed on the insulating layer 120. Then, the remaining elements of a pixel array 130 need only be formed in accordance with an existing method, and a description thereof will not be given.

Figure 5C:
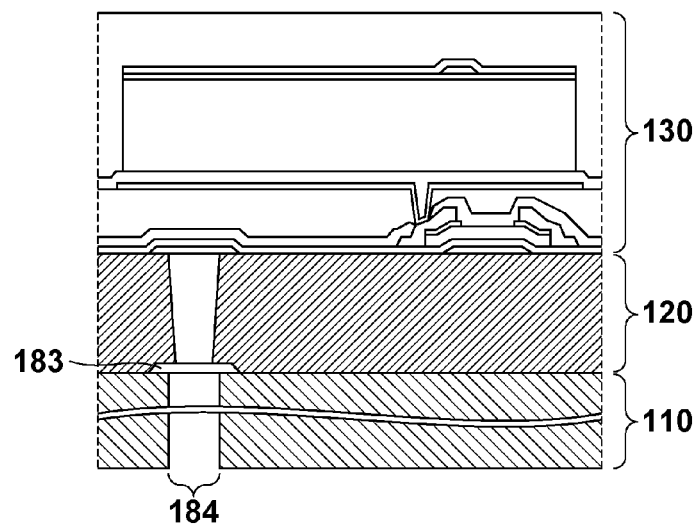

A contact hole (second contact hole) 184 is formed to extend through the substrate 110 so that the surface of the conductive pad 183 on the lower side (on the side of the substrate 110) is exposed, as shown in FIG. 5C. When, for example, the substrate 110 is formed by glass, and the contact hole 184 is formed by etching using hydrofluoric acid, the conductive pad 183 can use a metal having hydrofluoric acid resistance as a material.

A conductive member 185 made of a metal such as tungsten is filled in the contact hole 184, and a conductive pad 181 is formed on the back surface of the substrate 110 to cover the conductive member 185, thereby forming a pixel 200 shown in FIG. 2. Then, a detection apparatus 100 need only be manufactured by forming other components such as a scintillator 140 shown in FIGS. 1A and 1B in accordance with an existing method, and a description thereof will not be given.

In the method of manufacturing a detection apparatus 100, before a contact hole 184 is formed to extend through the substrate 110, the substrate 110 may be etched as a whole from the lower side to reduce the thickness of the substrate 110. When, for example, the prepared substrate 110 has a thickness of 0.5 mm to 1 mm, it may be etched until its thickness reaches about 0.1 mm to 0.3 mm. In general, as the thickness of the substrate 110 increases, the diameter of a contact hole extending through the substrate 110 also increases due to a limit in aspect ratio, and the size of the conductive pad 181, in turn, increases. As the size of the conductive pad 181 increases, the parasitic capacitances between the conductive pad 181 and the pixel array 130 also increase. Hence, the diameter of the contact hole 184 is reduced by reducing the thickness of the substrate 110. Using the manufacturing method described with reference to FIGS. 5A to 5C, a contact hole 184 extending through the substrate 110 and a contact hole 186 extending through the insulating layer 120 can be separately formed by arranging the conductive pad 183 between the substrate 110 and the insulating layer 120. This makes it possible to reduce the diameters of the contact holes 184 and 186 through which the conductive members 185 and 187 for electrically connecting the pixel array 130 and the conductive pad 181 to each other pass, thus reducing the size of the conductive pad 181.

Figure 6A:
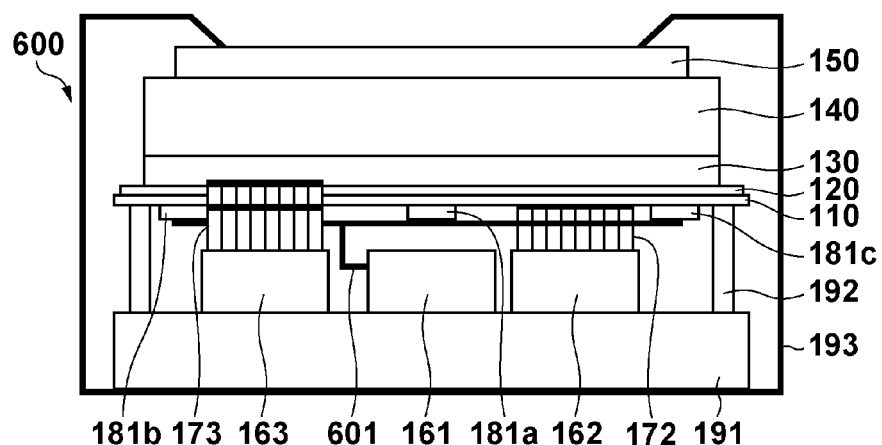
FIGS. 6A and 6B are a front schematic view and plan schematic view for explaining a modification to the first embodiment.
Figure 6B:
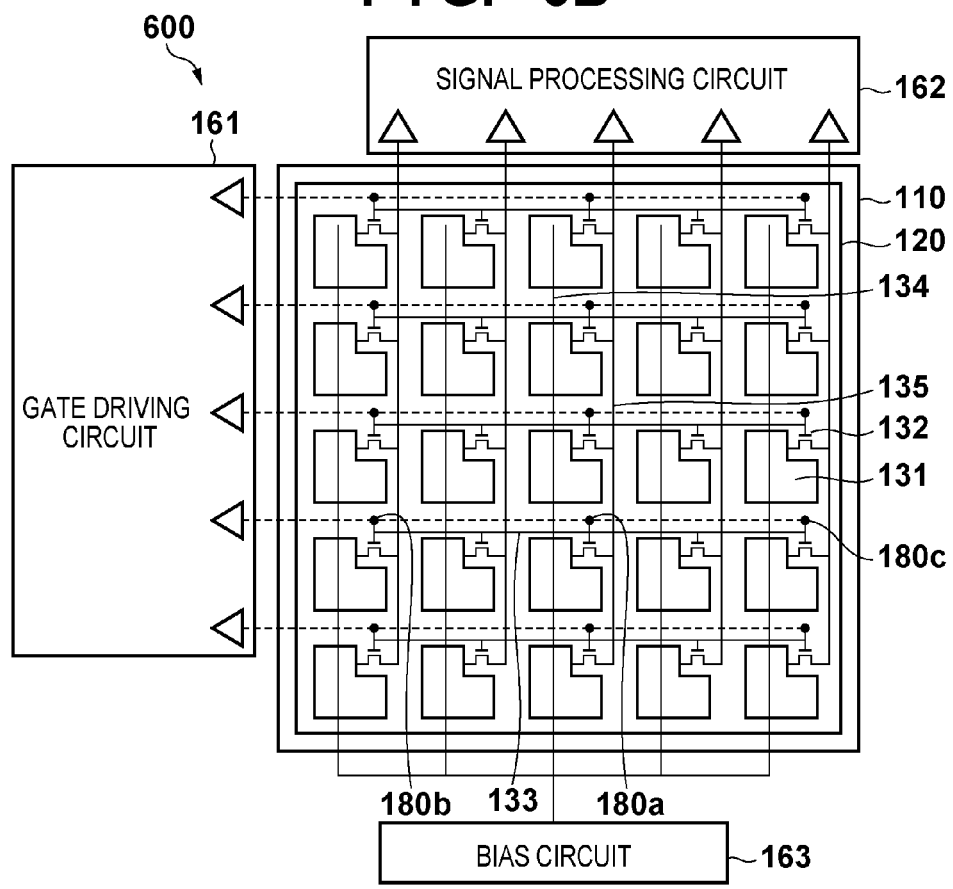

A detection apparatus 600 according to a modification to the detection apparatus 100 will be described next with reference to FIGS. 6A and 6B. FIG. 6A is a front schematic view of the detection apparatus 600, and FIG. 6B is a plan schematic view of the detection apparatus 600, like FIGS. 1A and 1B. The description of FIGS. 1A and 1B apply to that of FIGS. 6A and 6B, respectively. The same reference numerals as in the detection apparatus 100 denote the same components of the detection apparatus 600, and a description thereof will not be given.

In the detection apparatus 600, a signal voltage is applied from a gate driving circuit 161 to a single gate line 133 at a plurality of positions. In an example shown in FIGS. 6A and 6B, three conductive connection parts 180a to 180c are provided to the single gate line 133, and connected to the gate line 133 at different positions in a plurality of pixels aligned in the row direction. For example, the conductive connection part 180a is connected to the gate line 133 at the central pixel of the plurality of pixels aligned in the row direction, and the conductive connection parts 180b and 180c are connected to the gate line 133 at the end pixels of the plurality of pixels aligned in the row direction. The configurations of the conductive connection parts 180a to 180c are the same as that of the conductive connection part 180. Also, conductive pads 181a to 181c which constitute parts of the conductive connection parts 180a to 180c, respectively, are arranged on the back surface of a substrate 110. The conductive pad 181a is arranged at the central pixel of the pixels aligned in the row direction, and the conductive pads 181b and 181c are arranged at the end pixels of the pixels aligned in the row direction.

The gate driving circuit 161 and the conductive pads 181a to 181c may be connected to each other using a flexible cable 601 with bifurcated ends, as shown in FIG. 6A. Alternatively, a conductive line which connects the conductive pads 181a to 181c to each other may be formed on the lower side of the substrate 110, and this conductive line and the gate driving circuit 161 may be connected to each other via a flexible cable.

The detection apparatus 600 applies a signal voltage to the gate line 133 at a plurality of positions, and therefore can reduce deformation of the waveform of the signal voltage, compared to the detection apparatus 100. Also, even if the gate line 133 is partially disconnected, a signal voltage can be supplied to all pixels connected to the gate line 133.

Figure 7:
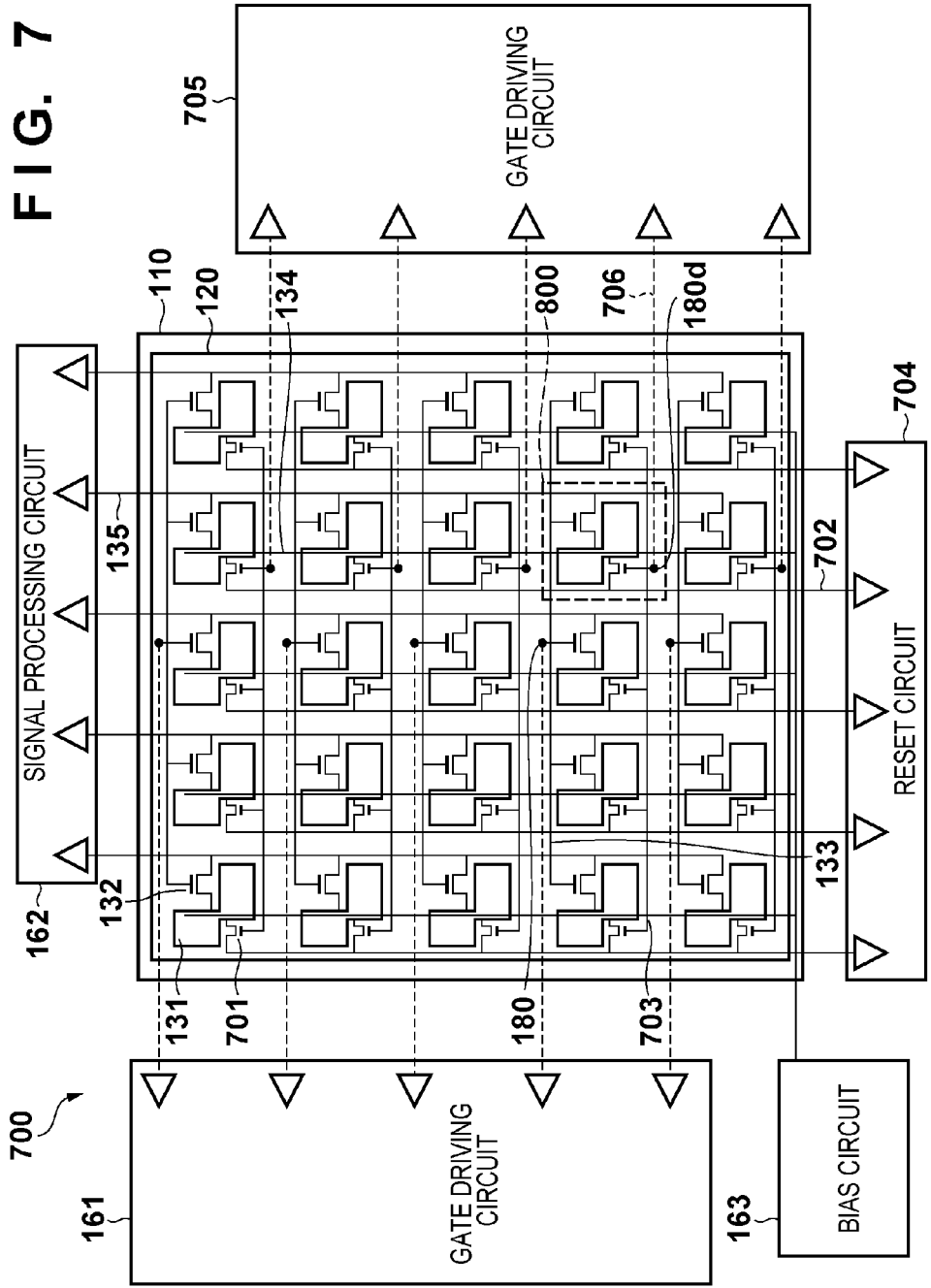
FIG. 7 is a plan schematic view for explaining the exemplary configuration of a detection apparatus 700 according to the second embodiment.

A detection apparatus 700 according to the second embodiment of the present invention will be described with reference to FIGS. 7 and 8. FIG. 7 corresponds to FIG. 1B, and is a plan schematic view of the detection apparatus 700. The entire configuration of the detection apparatus 700 is the same as that of the detection apparatus 100, and a description thereof will not be given. FIG. 7 shows a semiconductor element as an equivalent circuit, and does not illustrate some of components, for the sake of easy viewing. The same reference numerals as in the first embodiment denote the same components, and a description thereof will not be given.

A pixel array of the detection apparatus 700 can include photoelectric conversion elements 131 and thin film transistors 132 and 701 as circuit elements, and bias lines 134, signal lines 135, gate lines 133 and 703, and reset lines 702 as conductive lines. Also, the detection apparatus 700 can include a signal processing circuit 162, a reset circuit 704, and gate driving circuits 161 and 705 as electronic circuits. The reset circuit 704 and gate driving circuit 705 can be arranged at positions at which they face the back surface of a substrate 110. In particular, these electronic circuits may be arranged at positions at which they overlap the pixel array when viewed from the upper side of the detection apparatus 700.

The reset line 702 runs in the column direction, and is connected to the first main electrodes of the thin film transistors 701 of the pixels aligned in the column direction. The second main electrode of the thin film transistor 701 is connected to the photoelectric conversion element 131. The gate line 703 runs in the row direction, and is connected to the gate electrodes of the thin film transistors 701 of the pixels aligned in the row direction. The thin film transistor 701 functions as a reset transistor that serves to reset the photoelectric conversion element 131.

The gate line 703 is connected to the gate driving circuit 705 from the lower side of the substrate 110 via a conductive connection part 180d and a flexible cable 706. The configuration of the conductive connection part 180d is the same as that of the above-mentioned conductive connection part 180, and a description thereof will not be given. The reset line 702 is electrically connected to the reset circuit 704.

Figure 8:
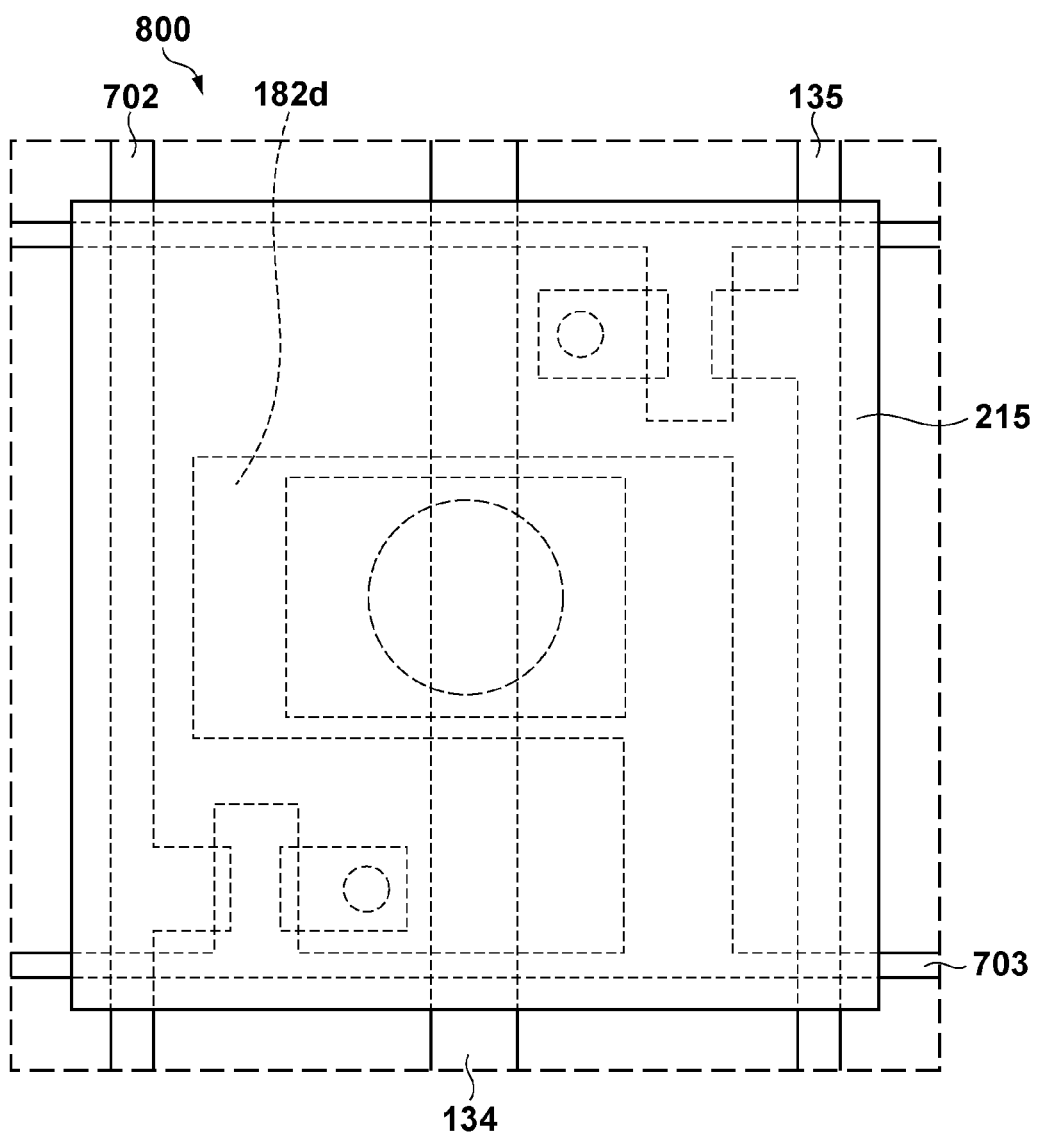
FIG. 8 is a plan view for explaining the exemplary configuration of a pixel 800 according to the second embodiment.

FIG. 8 is a plan view of a pixel 800 including the conductive connection part 180d shown in FIG. 7. A pixel including a conductive connection part 180 is the same as that described with reference to FIGS. 2A and 2B, and a description thereof will not be given. A sectional view of the pixel 800 is the same as that of the pixel 200 shown in FIG. 2B, and a description thereof will not be given. A conductive pad 182d of the conductive connection part 180d is connected to the gate line 703, as shown in FIG. 8. The conductive connection parts 180 and 180d may be arranged in different pixels, as shown in FIG. 7. Alternatively, the conductive connection parts 180 and 180d may be arranged in the same pixel as long as their layout is possible.

As described above, in the detection apparatus 700 as well, the parasitic capacitances between a semiconductor element and conductive lines included in a pixel array, and electronic circuits and conductive pad arranged under the substrate 110 can be reduced. Also, the above-mentioned various modifications to the detection apparatus 100 are similarly applicable to the detection apparatus 700. In the same manner as especially in the modification shown in FIGS. 6A and 6B, a plurality of conductive connection parts 180d may be arranged for the single gate line 703.

Figure 9:
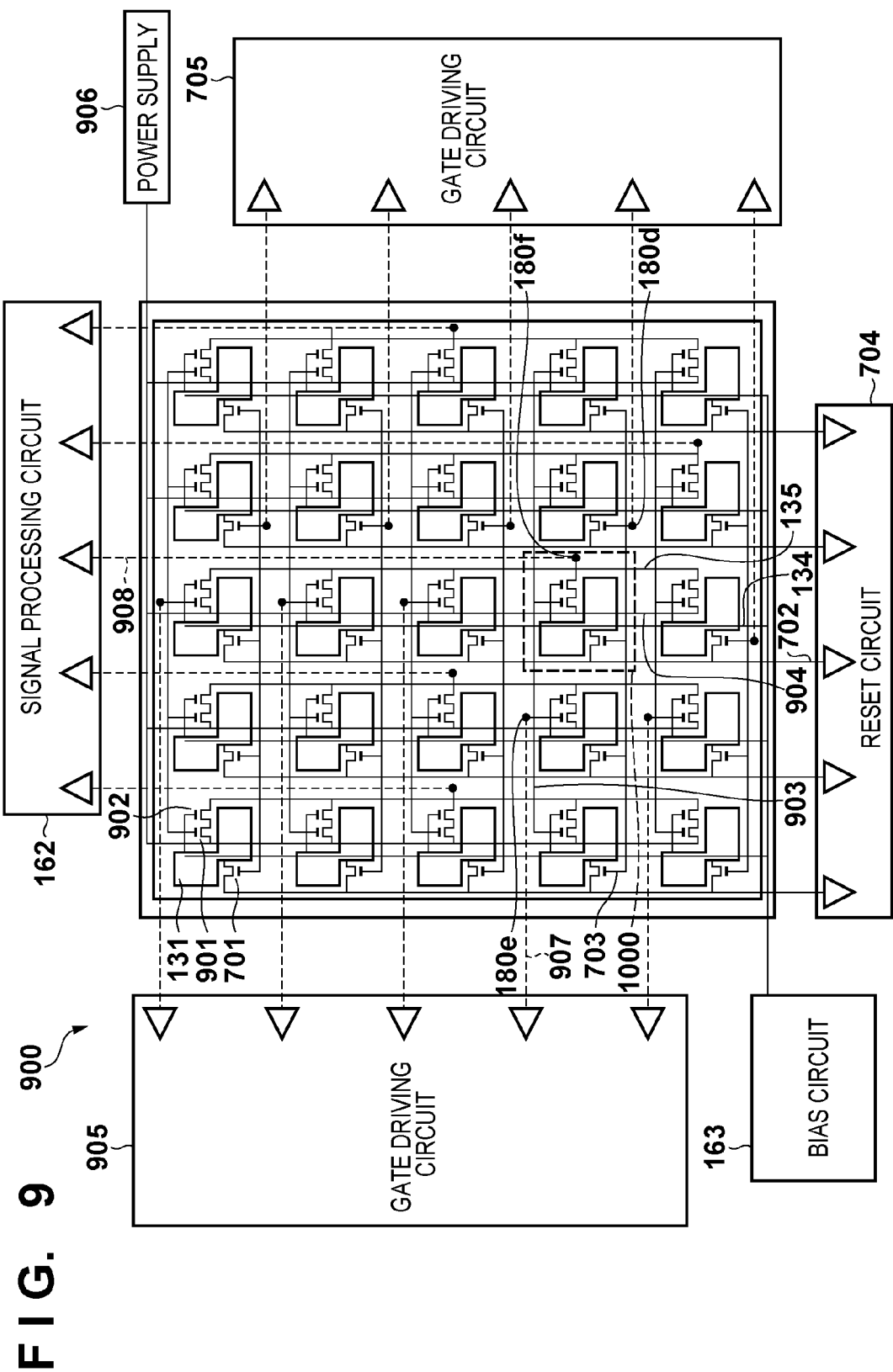
FIG. 9 is a plan schematic view for explaining the exemplary configuration of a detection apparatus 900 according to the third embodiment.

A detection apparatus 900 according to the third embodiment of the present invention will be described next with reference to FIGS. 9 and 10. FIG. 9 corresponds to FIG. 1B, and is a plan schematic view of the detection apparatus 900. The entire configuration of the detection apparatus 900 is the same as that of the detection apparatus 100, and a description thereof will not be given. FIG. 9 shows a semiconductor element as an equivalent circuit, and does not illustrate some of components, for the sake of easy viewing. The same reference numerals as in the first and second embodiments denote the same components, and a description thereof will not be given.

A pixel array of the detection apparatus 900 can include photoelectric conversion elements 131 and thin film transistors 701, 901, and 902 as circuit elements, and bias lines 134, signal lines 135, gate lines 703 and 903, reset lines 702, and power supply lines 904 as conductive lines. Also, the detection apparatus 900 can include a signal processing circuit 162, a reset circuit 704, and gate driving circuits 705 and 905 as electronic circuits. The gate driving circuit 905 can be arranged at a position at which it faces the back surface of a substrate 110. In particular, these electronic circuits may be arranged at positions at which they overlap the pixel array when viewed from the upper side of the detection apparatus 900. The detection apparatus 900 can also include a power supply 906.

The gate line 903 runs in the row direction, and is connected to the gate electrodes of the thin film transistors 901 of the pixels aligned in the row direction. The power supply line 904 runs in the column direction, and is connected to the first main electrodes of the thin film transistors 901 of the pixels aligned in the row direction. The second main electrode of the thin film transistor 901 is connected to the first main electrode of the thin film transistor 902. The second main electrode of the thin film transistor 902 is connected to the signal line 135. The gate electrode of the thin film transistor 902 is connected to the photoelectric conversion element 131. The thin film transistor 901 functions as a transfer transistor, and the thin film transistor 902 functions as a source follower transistor used to read a signal from the photoelectric conversion element 131.

The gate line 903 is connected to the gate driving circuit 905 from the lower side of the substrate 110 via a conductive connection part 180e and a flexible cable 907. The configuration of the conductive connection part 180e is the same as that of the above-mentioned conductive connection part 180, and a description thereof will not be given. The signal line 135 is connected to the signal processing circuit 162 from the lower side of the substrate 110 via a conductive connection part 180f and a flexible cable 908. The configuration of the conductive connection part 180f is the same as that of the above-mentioned conductive connection part 180, and a description thereof will not be given. The power supply line 904 is electrically connected to the power supply 906. In this manner, the detection apparatus 900 includes the conductive connection parts 180d, 180e, and 180f for the gate lines 703 and 903 and signal line 135, respectively, serving as a plurality of types of conductive lines via which different types of signals are transmitted.

Figure 10:
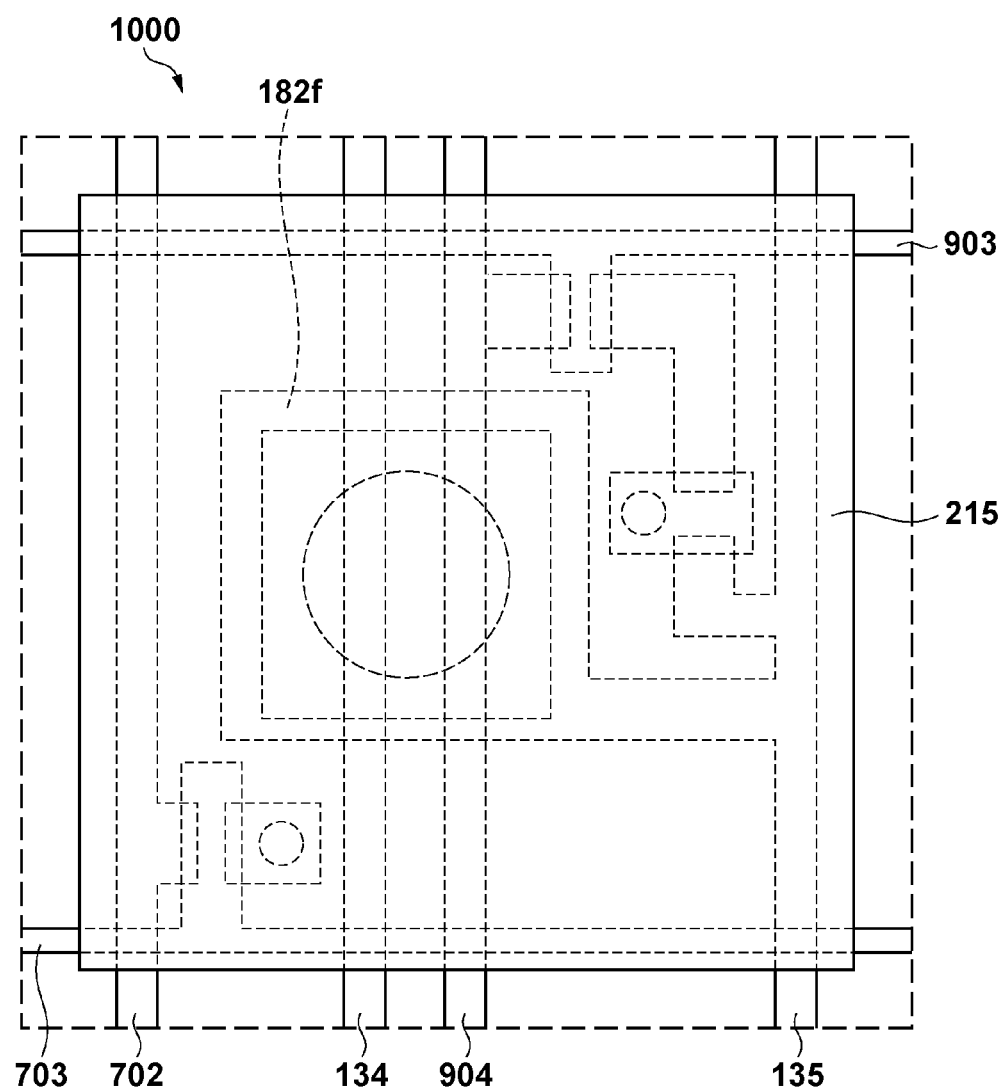
FIG. 10 is a plan view for explaining the exemplary configuration of a pixel 1000 according to the third embodiment.

FIG. 10 is a plan view of a pixel 1000 including the conductive connection part 180f shown in FIG. 9. A pixel including the conductive connection part 180e is the same as that described with reference to FIGS. 2A and 2B, and a description thereof will not be given. A sectional view of the pixel 1000 is the same as that of the pixel 200 shown in FIG. 2B, and a description thereof will not be given. A conductive pad 182f of the conductive connection part 180f is connected to the signal line 135, as shown in FIG. 10. The conductive connection parts 180d, 180e, and 180f may be arranged in different pixels, as shown in FIG. 9. Alternatively, the conductive connection parts 180d, 180e, and 180f may be arranged in the same pixel as long as their layout is possible.

As described above, in the detection apparatus 900 as well, the parasitic capacitances between a semiconductor element and conductive lines included in a pixel array, and electronic circuits and conductive pad arranged under the substrate 110 can be reduced. Also, the above-mentioned various modifications to the detection apparatus 100 are similarly applicable to the detection apparatus 900. In the same manner as especially in the modification shown in FIGS. 6A and 6B, a plurality of conductive connection parts may be arranged for a single gate line.

Although conductive connection parts are provided mainly on gate lines in the above-mentioned various embodiments, the present invention is also applicable to any conductive line included in a pixel array. For example, a conductive connection part may be provided on the power supply line 904 in the third embodiment, and a voltage may be applied from the central portion of the power supply line 904. This makes it possible to reduce crosstalk generated on the power supply lines 904.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-059656, filed Mar. 17, 2011, which is hereby incorporated by reference herein in its entirety.

What is claimed is:

1. A semiconductor apparatus including
a substrate,
a pixel array arranged on the substrate,
a first conductive pad which is arranged on the substrate and electrically connected to a circuit element of the pixel array, and
a second conductive pad arranged under the substrate to connect an electronic circuit, the apparatus comprising:
an insulating layer arranged between the substrate and the first conductive pad;
a third conductive pad arranged between the substrate and the insulating layer;
a first conductive member which passes through a first contact hole extending through the insulating layer, and connects the first conductive pad and the third conductive pad to each other; and
a second conductive member which passes through a second contact hole extending through the substrate, and connects the second conductive pad and the third conductive pad to each other,
wherein the pixel array further comprises a conductive line connected to circuit elements included in a plurality of pixels aligned in one of a row direction and a column direction, and
the first conductive pad is connected to the conductive line in an interval between the plurality of pixels aligned in the one of the row direction and the column direction.

2. The apparatus according to claim 1, wherein the insulating layer has a dielectric constant lower than a dielectric constant of the substrate.

3. The apparatus according to claim 1, wherein the first conductive pad is connected to the conductive line at a central portion of the plurality of pixels aligned in the one of the row direction and the column direction.

4. The apparatus according to claim 1, further comprising a plurality of conductive connection parts for the single conductive line, wherein
each of the plurality of conductive connection parts includes the first conductive pad, the second conductive pad, the third conductive pad, the first conductive member, and the second conductive member, and
the first conductive pad of each of the plurality of conductive connection parts is connected to the single conductive line at different positions in the plurality of pixels aligned in the one of the row direction and the column direction.

5. The apparatus according to claim 1, wherein
the pixel array comprises a plurality of types of conductive lines via which different types of signals are transmitted,
the apparatus comprises a conductive connection part for each of the plurality of types of conductive lines, and
the conductive connection part includes the first conductive pad, the second conductive pad, the third conductive pad, the first conductive member, and the second conductive member.

6. The apparatus according to claim 1, wherein
the pixel array includes, as the circuit element, a conversion element which converts an electromagnetic wave into an electrical signal and a transfer transistor configured to transfer a signal from the conversion element, and
the apparatus further comprises an electronic circuit which processes a signal transferred from the conversion element by the transfer transistor.

* * * * *